United States Patent
Murata et al.

(10) Patent No.: US 12,180,577 B2
(45) Date of Patent: Dec. 31, 2024

(54) TITANIUM SPUTTERING TARGET, PRODUCTION METHOD THEREFOR, AND METHOD FOR PRODUCING TITANIUM-CONTAINING THIN FILM

(71) Applicant: JX Nippon Mining & Metals Corporation, Tokyo (JP)

(72) Inventors: Shuhei Murata, Ibaraki (JP); Daiki Shono, Ibaraki (JP)

(73) Assignee: JX Advanced Metals Corporation, Minato-ku (JP)

(*) Notice: Subject to any disclaimer, the term of this patent is extended or adjusted under 35 U.S.C. 154(b) by 129 days.

(21) Appl. No.: 17/666,703

(22) Filed: Feb. 8, 2022

(65) Prior Publication Data
US 2022/0162743 A1    May 26, 2022

Related U.S. Application Data

(62) Division of application No. 16/648,042, filed as application No. PCT/JP2018/026595 on Jul. 13, 2018, now abandoned.

(30) Foreign Application Priority Data

Sep. 21, 2017 (JP) ................. 2017-181694

(51) Int. Cl.
C23C 14/34 (2006.01)
(52) U.S. Cl.
CPC ............... *C23C 14/3414* (2013.01)
(58) Field of Classification Search
None
See application file for complete search history.

(56) References Cited

U.S. PATENT DOCUMENTS

| 5,772,860 A | 6/1998 | Sawada et al. |
| 5,798,005 A * | 8/1998 | Murata .............. H01J 37/3426 |
| | | 148/670 |
| 2001/0015242 A1 | 8/2001 | Yao et al. |
| 2002/0007880 A1 | 1/2002 | Segal et al. |

(Continued)

FOREIGN PATENT DOCUMENTS

| JP | 8-333676 A | 12/1996 |
| JP | 11-50244 A | 2/1999 |

(Continued)

OTHER PUBLICATIONS

International Search Report and Written Opinion mailed Oct. 16, 2018 in corresponding PCT application No. PCT/JP2018/026595.

(Continued)

*Primary Examiner* — Jason Berman
(74) *Attorney, Agent, or Firm* — Nields, Lemack & Frame, LLC (57) ABSTRACT

Provided is a titanium sputtering target having a recrystallized structure having an average crystal grain diameter of 1 μm or less. Also provided is a method for producing a titanium sputtering target, the method comprising the steps of: subjecting a cut titanium ingot to large strain processing to provide a processed sheet; subjecting the processed sheet to cold rolling at a rolling ratio of 30% or more to provide a rolled sheet; and subjecting the rolled sheet to a heat treatment at a temperature of 320° C. or less.

20 Claims, 6 Drawing Sheets

| Example 2 (Heat Treatment Temperature 300 °C) | Comparative Example 1 (Heat Treatment Temperature 350 °C) | Comparative Example 2 (Heat Treatment Temperature 400 °C) | Comparative Example 3 (Heat Treatment Temperature 455 °C) |

(56) References Cited

U.S. PATENT DOCUMENTS

| | | |
|---|---|---|
| 2003/0052000 A1 | 3/2003 | Segal et al. |
| 2013/0001069 A1* | 1/2013 | Nakashima ......... C23C 14/3414 |
| | | 148/670 |
| 2013/0186753 A1 | 7/2013 | Tsukamoto et al. |
| 2016/0005576 A1 | 1/2016 | Tsukamoto |

FOREIGN PATENT DOCUMENTS

| | | | | |
|---|---|---|---|---|
| JP | 11229130 A | * | 8/1999 | .............. C22F 1/183 |
| JP | 2016-145384 A | | 8/2016 | |
| JP | 6077102 B2 | | 2/2017 | |
| KR | 10-2013-0076863 A | | 7/2013 | |
| RU | 2224046 C1 | | 2/2004 | |
| RU | 2622536 C2 | | 6/2017 | |
| WO | 2005/080623 A1 | | 9/2005 | |
| WO | 2014/038487 A1 | | 3/2014 | |

OTHER PUBLICATIONS

International Preliminary Report on Patentability issued Mar. 24, 2020 in corresponding PCT application No. PCT/JP2018/026595.
Singaporean communication dated May 18, 2021 in corresponding Singaporean patent application No. 11202002496P.
European communication dated Jul. 26, 2021 in corresponding European patent application No. 18859576.3.
Office action mailed Jun. 7, 2021 in co-pending U.S. Appl. No. 16/648,042.
Office action mailed Jul. 19, 2021 in co-pending U.S. Appl. No. 16/648,042.
Final Rejection mailed Dec. 22, 2021 in co-pending U.S. Appl. No. 16/648,042.

* cited by examiner

Example 1                          Example 2

(Heat Treatment Temperature 270 °C)     (Heat Treatment Temperature 300 °C)

Comparative Example 7 (Forging Temperature 400 °C, Δε=3)   Comparative Example 8 (Forging Temperature 400 °C, Δε=9)   Comparative Example 6 (Forging Temperature 600 °C, Δε=9)

Example 1  Example 2

TITANIUM SPUTTERING TARGET, PRODUCTION METHOD THEREFOR, AND METHOD FOR PRODUCING TITANIUM-CONTAINING THIN FILM

This application is a divisional of U.S. patent application Ser. No. 16/648,042 filed Mar. 17, 2020, which is a 371 of PCT/JP2018/026595 filed Jul. 13, 2018, the disclosures of which are incorporated herein by reference in their entireties.

TECHNICAL FIELD

The present disclosure relates to a titanium sputtering target, a production method therefor, and a method for producing a titanium-containing thin film. More particularly, the present disclosure relates to a titanium sputtering target used as a sputtering source for forming various thin films (for example, electrodes, gates, wirings, elements, insulating films, and protective films) in various electronic devices such as semiconductor devices, and a method for producing the same, as well as a method for producing a titanium-containing thin film.

BACKGROUND ART

In recent years, due to miniaturization and higher integration of semiconductor devices, various thin films in semiconductor devices have been required to be thinner and finer. Examples of a thin film material include molybdenum, tungsten, and titanium. Among them, titanium is often used because of its excellent strength, workability, and corrosion resistance. As a method of forming the thin film, sputtering is generally used, and as a sputtering source (thin film material), a titanium target is used.

In sputtering, a high voltage is applied between a substrate and a titanium target while introducing an inert gas (e.g., an Ar gas) in vacuum, and ions such as ionized $Ar^+$ are allowed to collide with the titanium target, and titanium atoms are released by its collision energy to deposit them onto the substrate, whereby a titanium-containing thin film can be formed. At this time, when a titanium nitride thin film is formed as the titanium-containing thin film, a mixed gas of an argon gas and a nitrogen gas is used.

Recently, in order to increase production efficiency, high-speed sputtering (high-power sputtering) is particularly required among sputtering processes. However, the conventional titanium target may generate cracks or breakage under higher load conditions such as high-speed sputtering, which is a factor that hinders stable sputtering. Also, there is a problem that particles and nodules tend to be generated during sputtering. Therefore, reduction of impurities in the titanium target has been performed. However, since there is a limit for the reduction of impurities, a fundamental solution to this problem has not been achieved.

In order to solve the above problems, Patent Document 1 proposes a titanium target having a purity of 5N5 (99.9995%) or more, no macro pattern on the surface, and an average crystal grain diameter of a recrystallized structure of 10 μm or less.

CITATION LIST

Patent Literature

Patent Document 1: Japanese Patent No. 6077102 B

SUMMARY OF INVENTION

Technical Problem

Since the titanium target of Patent Document 1 has higher purity, generation of particles during sputtering can be suppressed. However, the titanium target of Patent Document 1 actually has an average crystal grain diameter of a recrystallized structure of at least about 8 μm. If the average crystal grain diameter of the recrystallized structure is higher, the particles tend to be accumulated on a surface or nodules tend to be generated after a burn-in process. Therefore, in view of the state of art that will be required in the future, it is desired that the crystal grain diameter of the recrystallized structure is further reduced to improve an effect of suppressing generation of particles and nodules.

Further, sputtering under higher load conditions will be expected in the future. Therefore, even with the titanium target of Patent Document 1, the effect of suppressing the generation of cracks or breakage during sputtering could not be sufficient.

Embodiments of the present invention have been made in order to solve the above problems. An object of the present invention is to provide a titanium sputtering target which can suppress not only cracks or breakage during sputtering, but also can suppress generation of particles and nodules, and to provide a method for producing the same.

Solution to Problem

As a result of intensive studies to solve the above problems, the present inventors have found that the cracks or breakage in the titanium sputtering target during sputtering is related to the strength of the titanium sputtering target, and an average crystal grain diameter of a recrystallized structure of 1 μm or less can increase the strength of the titanium sputtering target to suppress the cracks or breakage during the sputtering.

Further, the present inventors have found that the generation of particles and nodules during sputtering is related to the average crystal grain diameter of the recrystallized structure, and the average crystal grain diameter of the recrystallized structure of 1 μm or less can suppress the generation of the particles and the nodules.

Furthermore, the present inventors have found that the average crystal grain diameter of the recrystallized structure of the titanium sputtering target can be controlled to 1 μm or less by optimizing the production conditions.

An embodiment of the present invention has been completed based on the above findings.

Thus, a titanium sputtering target according to an embodiment of the present invention comprises a recrystallized structure having an average crystal grain diameter of 1 μm or less.

A method for producing a titanium sputtering target according to an embodiment of the present invention comprises the steps of: subjecting a cut titanium ingot to large strain processing to provide a processed sheet; subjecting the processed sheet to cold rolling at a rolling ratio of 30% or more to provide a rolled sheet; and subjecting the rolled sheet to a heat treatment at a temperature of 320° C. or less.

Furthermore, a method for producing a titanium-containing thin film according to an embodiment of the present invention uses the titanium sputtering target as a sputtering source.

Advantageous Effects of Invention

According to embodiments of the present invention, it is possible to provide a titanium sputtering target which can suppress not only cracks or breakage during sputtering, but also can suppress generation of particles and nodules, and to provide a method for producing the same.

DESCRIPTION OF THE PREFERRED EMBODIMENTS

Hereinafter, preferred embodiments of the present invention will be specifically described, but the present invention should not be construed as being limited thereto, and various modifications and improvements may be made based on the knowledge of a person skilled in the art, without departing from the spirit of the present invention. A plurality of elements disclosed in each embodiment can form various inventions by proper combinations. For example, some elements may be deleted from all the elements described in the embodiments, or elements of different embodiments may be optionally combined.

A titanium sputtering target according to an embodiment of the present invention (which may be, hereinafter, abbreviated as "titanium target") includes a recrystallized structure having an average crystal grain diameter of 1 μm or less.

As used herein, the "average crystal grain diameter" means a value obtained from an average line segment length per one crystal grain of test lines across interiors of crystal grains on a surface of the titanium target (a sputtering surface), in accordance with the cutting method of JIS G0551: 2013. EBSD measurement (an area of 10 μm×10 μm, magnifications of 10000) or the like can be used for the observation of the crystal grain in this method.

Although an initial surface of the titanium target is smooth, the surface of the titanium target becomes rough after an operation for stabilizing characteristics of the titanium target (i.e., after a burn-in process). Since the surface of the titanium target after the burn-in process becomes rougher as the average crystal grain diameter of the recrystallized structure is larger, particles are easily accumulated or nodules are easily generated on the surface of the titanium target. Since the conventional titanium target has an average crystal grain diameter of a recrystallized structure of at least about 8 μm, the titanium target according to the embodiment of the present invention has a higher effect of suppressing generation of particles and nodules during sputtering than that of the conventional titanium target.

Further, the strength of the titanium target increases as the average crystal grain diameter of the recrystallized structure decreases. In fact, according to the Hall-Petch rule, it is known that as the crystal grain diameter decreases, a yield stress (strength) increases. The titanium target according to an embodiment of the present invention has a lower average crystal grain diameter of the recrystallized structure than that of the conventional titanium target, and thus can increase the strength of the titanium target. As a result, the titanium target according to an embodiment of the present invention has a higher effect of suppressing cracks or breakage during sputtering than that of the conventional titanium target.

A Vickers hardness of the titanium target according to an embodiment of the present invention is not particularly limited. It may preferably be 140 Hv or more, and more preferably from 140 Hv to 250 Hv, and still more preferably from 150 Hv to 200 Hv. As used herein, the "Vickers hardness of the titanium target" means a value obtained by a method based on a Vickers hardness test of JIS Z2244: 2009, on a surface of the titanium target (a sputtering surface).

In terms of stably obtaining the effect of the embodiment according to the present invention as described above, the average crystal grain diameter of the recrystallized structure is preferably 0.9 μm or less, and more preferably from 0.1 μm to 0.8 μm, and still more preferably from 0.2 μm to 0.7 μm.

A purity of the titanium target according to an embodiment of the present invention is not particularly limited, because the effect of suppressing the generation of particles and nodules during sputtering is enhanced by decreasing the average crystal grain diameter of the recrystallized structure. However, this effect can be further improved by increasing the purity of the titanium target. Therefore, the purity of the titanium target according to an embodiment of the present invention is preferably 4N (99.99% by mass) or more, and more preferably 4N5 (99.995% by mass) or more, and still more preferably 5N (99.999% by mass or more, and most preferably 5N5 (99.9995% by mass) or more. As used herein, the purity of the titanium target of 4N (99.99% by mass) or more means that when the composition is analyzed by glow discharge mass spectrometry (GDMS), the total amount of elements other than titanium contained in the titanium target (e.g., Na, Al, Si, K, Cr, Mn, Fe, Co, Ni, Cu, Zn, Zr or the like) is less than 0.01% by mass (100 ppm by mass).

The titanium target according to an embodiment of the present invention having the features as described above can be produced by a method including a step of subjecting a cut titanium ingot to large strain processing to provide a processed sheet (which may be, hereinafter, abbreviated as a "large strain processing step"), a step of subjecting the processed sheet to cold rolling at a rolling ratio of 30% or more to provide a rolled sheet (which may be, hereinafter, abbreviated as a "rolling step"), and a step of subjecting the rolled sheet to a heat treatment at a temperature of 320° C. or less (which may be, hereinafter, abbreviated as a "heat treatment step"). Other steps are not particularly limited, and they may be carried out according to a known method.

The crystal grain diameter of the recrystallized structure tends to be lower as a strain amount before recrystallization is higher. Therefore, in the forging step, the crystal grain diameter is reduced by carrying out the large strain processing (also referred to as a "huge strain processing step"). The large strain processing is not particularly limited. Examples of the large strain processing include a multidirectional forging method, an ECAP method, an HPT method, and an ARB method. Among them, as the large strain processing, the multidirectional forging method is preferably used, in terms of a processing speed, uniformity of strain, variability in size, necessity of new equipment investment, costs and the like. Further, the multidirectional forging method is to carrying out forging in multiple axial directions and apply a large strain by increasing the number of cycles. Therefore, when being compared with kneading forging or the like, the multidirectional forging method also has an advantage that it is difficult to generate cracks due to kneading, because the multidirectional forging method performs the forging while changing the axis.

Further, in the large strain processing step, even if the strain amount before recrystallization is relatively small, the size of the crystal having the recrystallized structure can be decreased by lowering a processing temperature. Therefore, it is desirable to adjust the processing temperature in accordance with the total strain amount ($\Delta\varepsilon$) of the processed sheet. For example, when the total strain of the processed sheet is about 2, the processing temperature can be decreased to about room temperature, so that the size of the crystal having the recrystallized structure can be decreased.

The processing temperature in the large strain processing step is not particularly limited. It may preferably be 500° C. or less, and more preferably from room temperature to 450° C., and even more preferably from 200° C. to 400° C., in terms of stably accumulating the strain. If the processing temperature is too high, the strain is relaxed due to dynamic recrystallization during processing, and as a result, the average crystal grain diameter of the recrystallized structure after the heat treatment step tends to increase.

The total strain amount ($\Delta\varepsilon$) of the processed sheet obtained in the large strain processing step is not particularly limited. It may preferably be 2 or more, and more preferably more than 3 and 13 or less, and even more preferably more than 5 and 13 or less, in terms of stably reducing the crystal grain diameter of the recrystallized structure. If the total strain amount of the processed sheet is too low, the average crystal grain diameter of the recrystallized structure of the titanium target finally obtained tends to increase.

As used herein, the "total strain amount ($\Delta\varepsilon$) of the processed sheet obtained in the large strain processing step" can be represented by the following equation, when the large strain processing is the multidirectional forging.

$$\Delta\varepsilon = -\sum_{k=1}^{3n} \ln\left(\frac{h_k}{h_{0k}}\right)$$ [Equation 1]

In the equation, n is the number of cycles of multidirectional forging, $h_{0k}$ is a thickness of a material in a longitudinal direction before a $k^{th}$ processing, and $h_k$ is a thickness of a portion after processing, which portion was in the longitudinal direction of the material before the $k^{th}$ processing. Here, for the number of cycles of the multidirectional forging, when the total three pressing: one pressing in each of three axial directions (x direction, y direction, and z direction) is carried out, it is determined to be one cycle.

The total strain amount of the processed sheet can be controlled by adjusting the number of cycles of the multidirectional forging and the strain amount per one press, for example when the large strain processing is the multidirectional forging. For example, by adjusting the strain amount per one press to 0.2 and the number of cycles to 15, the total strain amount of the forged sheet can be controlled to 9.

The titanium ingot used in the large strain processing step is not particularly limited, and it can be produced using a method known in the art. However, in terms of further improving the effect of suppressing the generation of particles and nodules during sputtering, a purity of the titanium ingot is preferably 4N (99.99% by mass) or more, and more preferably 4N5 (99.995% by mass) or more, and even more preferably 5N (99.999% by mass) or more, and most preferably 5N5 (99.9995% by mass) or more. As used herein, the purity of the titanium ingot of 4N (99.99% by mass) or more means that the composition is analyzed by glow discharge mass spectrometry (GDMS), the total amount of elements other than titanium (e.g., Na, Al, Si, K, Cr, Mn, Fe, Co, Ni, Cu, Zn, Zr or the like) is less than 0.01% by mass (100 ppm by mass).

When producing a high-purity titanium target of 5N5 (99.9995% by mass) or more, a high-purity titanium material obtained by a molten salt electrolysis method can be melted by EB (electron beam), cooled and solidified to obtain the high-purity titanium ingot. Here, it is preferable that an atmosphere of the molten salt electrolysis is an inert atmosphere, an initial cathode current density is 0.6 A/cm² or less which is a low current density, during electrolysis, and an electrolysis temperature is from 600° C. to 800° C.

Next, in the rolling step, the processed sheet obtained in the large strain processing step is subjected to cold rolling. It has been found through experiments that when the processed sheet is subjected to cold rolling, an excessively low rolling ratio tends to increase the average crystal grain diameter of the recrystallized structure after the heat treatment step. Therefore, in an embodiment of the present invention, the rolling ratio in the cold rolling is defined as 30% or more, in terms of controlling the average crystal grain diameter of the recrystallized structure to 1 μm or less. If the rolling ratio in the cold rolling is less than 30%, the average crystal grain diameter of the recrystallized structure will be more than 1 μm, so that the effect of the embodiment of the present invention cannot be obtained. Further, the rolling ratio in the cold rolling is preferably 50% or more, and more preferably 60% or more, and even more preferably more than 70%, in terms of stably controlling the average crystal grain diameter of the recrystallized structure. Although an upper limit of the rolling ratio in the cold rolling is not particularly limited, it may preferably be 95%, and more preferably 90%.

Various conditions (for example, the number of passes and a roll rate) during the cold rolling are not particularly limited as long as they are set as needed so as to obtain the predetermined rolling ratio depending on devices to be used. A temperature during the cold rolling is not particularly limited as long as it is within a general range, and is generally room temperature.

Next, in the heat treatment step, the rolled sheet obtained in the rolling step is subjected to a heat treatment. Experiments have shown that when the rolled sheet is subjected to the heat treatment, the crystal grain diameter tends to decrease as a heat treatment temperature decreases. Therefore, in an embodiment of the present invention, the heat treatment temperature of the rolled sheet is set to 320° C. or less, in terms of controlling the average crystal grain diameter of the recrystallized structure to 1 μm or less. If the heat treatment temperature of the rolled sheet is more than 320° C., the average crystal grain diameter of the recrystallized structure is more than 1 μm, so that the effect of the embodiment of the present invention cannot be obtained. The heat treatment temperature of the rolled sheet is preferably from 250° C. to 320° C., and more preferably from 260° C. to 320° C., in terms of stably controlling the average crystal grain diameter of the recrystallized structure.

A heat treatment time may be set as needed, depending on the size of the rolled sheet, and is not particularly limited. It may generally be from 20 minutes to 60 minutes, and preferably from 30 minutes to 50 minutes.

The heat-treated sheet (titanium target) obtained in the heat treatment step is subjected to processing such as surface processing, and then diffusion-bonded to a backing plate and used.

The titanium target produced as described above has a recrystallized structure having an average crystal grain diameter of 1 μm or less, so that, in addition to cracks or breakage during sputtering, the generation of particles and nodules can also be suppressed. Therefore, the titanium target is useful as a sputtering source for forming a titanium-containing thin film, and is particularly suitable for use in high-speed sputtering (high-power sputtering) under higher load conditions.

EXAMPLES

Hereinafter, the present invention will be more specifically described with reference to Examples, but the present invention is not limited to these Examples.

Example 1

A titanium ingot having a purity of 4N5 (99.995% by mass) was cut and subjected to large strain processing. As the large strain processing, multidirectional forging was carried out at a forging temperature of 400° C. and with a cycle number of 15 cycles. The total strain amount ($\Delta\varepsilon$) of the resulting forged sheet (processed sheet) was 9. The forged sheet was then subjected to cold rolling at room temperature at a rolling rate of 85% with the set number of passes of 16 and the set roll rate of 10 m/min to obtain a rolled sheet. The rolled sheet was then subjected to a heat treatment at 270° C. for 40 minutes to obtain a heat-treated sheet (a titanium target).

Example 2

A titanium target was obtained under the same conditions as those of Example 1, with the exception that the heat treatment temperature was changed to 300° C.

Example 3

A titanium target was obtained under the same conditions as those of Example 1, with the exception that a titanium ingot having a purity of 3N5 (99.95% by mass) was used.

Example 4

A titanium target was obtained under the same conditions as those of Example 1, with the exception that a titanium ingot having a purity of 4N85 (99.9985% by mass) was used and the heat treatment temperature was changed to 320° C.

Example 5

A titanium target was obtained under the same conditions as those of Example 1, with the exception that a titanium ingot having a purity of 5N5 (99.9995% by mass) was used.

Comparative Example 1

A titanium target was obtained under the same conditions as those of Example 1, with the exception that the heat treatment temperature was changed to 350° C.

Comparative Example 2

A titanium target was obtained under the same conditions as those of Example 1, with the exception that the heat treatment temperature was changed to 400° C.

Comparative Example 3

A titanium target was obtained under the same conditions as those of Example 1, with the exception that the heat treatment temperature was changed to 455° C.

Comparative Example 4

A titanium target was obtained under the same conditions as those of Comparative Example 1, with the exception that the forged sheet was subjected to cold rolling at a rolling ratio of 70% at room temperature and with the set number of passes of 16 and the set roll rate of 10 m/min to obtain a rolled sheet.

Comparative Example 5

A titanium target was obtained under the same conditions as those of Comparative Example 2, with the exception that the rolled sheet was subjected to cold rolling at a rolling ratio of 70% at room temperature and with the set number of passes of 16 and the set roll rate of 10 m/min.

Comparative Example 6

A titanium ingot having a purity of 4N5 was cut, and multidirectional forging was carried out at a forging temperature of 600° C. and with the number of cycles of 15 cycles. The total strain amount of the resulting forged sheet was 9. The forged sheet was then subjected to a heat treatment at a temperature of 455° C. for 40 minutes to obtain a titanium target.

Comparative Example 7

A titanium target was obtained under the same conditions as those of Comparative Example 6, with the exception that a forged sheet having a total strain amount of 3 was produced by changing the forging temperature to 400° C. and the number of cycles to 5.

Comparative Example 8

A titanium target was obtained under the same conditions as those of Comparative Example 6, with the exception that the forging temperature was changed to 400° C.

Comparative Example 9

A titanium target was obtained under the same conditions as those of Comparative Example 4, with the exception that the multidirectional forging was carried out at a forging temperature of 600° C. and with the number of cycles of 15 to obtain a forged sheet having a total strain amount of 9.

Comparative Example 10

A titanium target was obtained under the same conditions as those of Comparative Example 4, with the exception that the multidirectional forging was carried out at a forging temperature of 400° C. and with the number of cycles of 5 to obtain a forged sheet having a total strain amount of 3.

For each of the titanium targets obtained in the above Examples and Comparative Examples, the average crystal grain diameter of the recrystallized structure was determined according to the method as described above, and amounts of elements other than titanium were measured by glow discharge mass spectrometry (GDMS). Table 1 shows results of the average crystal grain diameter of the recrystallized structure together with the production conditions. Table 2 shows results of the glow discharge mass spectrometry.

TABLE 1

|  | Large Strain Processing Step | | | Rolling Step | | | Heat Treatment Step | | Average Grain Diameter (μm) | Vickers Hardness (Hv) |
|---|---|---|---|---|---|---|---|---|---|---|
|  | Temperature (° C.) | Number of Cycles (times) | Δε | Rolling Ratio (%) | Number of Passes (times) | Roll Rate (m/min) | Temperature (° C.) | Time (min) | | |
| Example 1 | 400 | 15 | 9 | 85 | 16 | 10 | 270 | 40 | 0.38 | 180.0 |
| Example 2 | 400 | 15 | 9 | 85 | 16 | 10 | 300 | 40 | 0.70 | 160.2 |
| Example 3 | 400 | 15 | 9 | 85 | 16 | 10 | 270 | 40 | 0.30 | 195.8 |
| Example 4 | 400 | 15 | 9 | 85 | 16 | 10 | 320 | 40 | 0.95 | 149.3 |
| Example 5 | 400 | 15 | 9 | 85 | 16 | 10 | 270 | 40 | 0.41 | 178.8 |
| Comp. 1 | 400 | 15 | 9 | 85 | 16 | 10 | 350 | 40 | 2.58 | 126.5 |
| Comp. 2 | 400 | 15 | 9 | 85 | 16 | 10 | 400 | 40 | 3.16 | 124.9 |
| Comp. 3 | 400 | 15 | 9 | 85 | 16 | 10 | 455 | 40 | 8.70 | 106.5 |
| Comp. 4 | 400 | 15 | 9 | 70 | 16 | 10 | 350 | 40 | 3.30 | 120.9 |
| Comp. 5 | 400 | 15 | 9 | 70 | 16 | 10 | 400 | 40 | 4.40 | 116.7 |
| Comp. 6 | 600 | 15 | 9 | — | — | — | 455 | 40 | *1 | 99.9 |
| Comp. 7 | 400 | 5 | 3 | — | — | — | 455 | 40 | *1 | 106.6 |
| Comp. 8 | 400 | 15 | 9 | — | — | — | 455 | 40 | *2 | 118.0 |
| Comp. 9 | 600 | 15 | 9 | 70 | 16 | 10 | 350 | 40 | 5.76 | 105.6 |
| Comp. 10 | 400 | 5 | 3 | 70 | 16 | 10 | 350 | 40 | 4.77 | 118.2 |

(Remarks)
*1) The average crystal grain diameter of the recrystallized structure could not be determined because there were many portions that had not been recrystallized.
*2) Although recrystallization was insufficient, the average crystal grain diameter of a part of the recrystallized structure formed was 21.70 μm.

TABLE 2

| Elements | Example | | | | | Comparative Example | | |
|---|---|---|---|---|---|---|---|---|
|  | 1 | 2 | 3 | 4 | 5 | 1 | 2 | 3 |
| Ag | <0.02 | <0.1 | <0.1 | <0.1 | <0.02 | <0.1 | <0.1 | <0.1 |
| Al | 1.0 | 1.0 | 3.3 | 1.7 | 0.2 | 0.8 | 0.6 | 1.4 |
| As | <0.1 | <0.1 | <0.1 | <0.1 | <0.1 | <0.1 | <0.1 | <0.1 |
| Am | <0.1 | <0.1 | <0.1 | <0.1 | <0.1 | <0.1 | <0.1 | <0.1 |
| B | <0.01 | <0.01 | <0.01 | <0.01 | <0.01 | <0.01 | <0.01 | <0.01 |
| Ba | <0.01 | <0.01 | <0.01 | <0.01 | <0.01 | <0.01 | <0.01 | <0.01 |
| Be | <0.01 | <0.01 | <0.01 | <0.01 | <0.01 | <0.01 | <0.01 | <0.01 |
| Bi | <0.01 | <0.01 | <0.01 | <0.01 | <0.01 | <0.01 | <0.01 | <0.01 |
| C | <10 | <10 | <10 | <10 | <10 | <10 | <10 | <10 |
| Ca | <0.1 | <0.1 | <0.1 | <0.1 | <0.1 | <0.1 | <0.1 | <0.1 |
| Cd | <0.1 | <0.1 | <0.1 | <0.1 | <0.1 | <0.1 | <0.1 | <0.1 |
| Cl | <0.1 | <0.1 | 1.5 | 0.1 | <0.01 | <0.1 | <0.1 | <0.1 |
| Co | <0.01 | <0.1 | <0.1 | <0.1 | <0.01 | <0.1 | <0.1 | <0.1 |
| Cr | 0.1 | 0.1 | 0.3 | 0.1 | 0.7 | <0.1 | 0.1 | <0.1 |
| Cu | 0.4 | 0.4 | 2.7 | 0.2 | 0.5 | 0.2 | 0.2 | 0.1 |
| Fe | 5.7 | 5.7 | 48.4 | 3.7 | 0.3 | 5.9 | 5.6 | 4.1 |
| Ga | <0.05 | <0.05 | <0.05 | <0.05 | <0.05 | <0.05 | <0.05 | <0.05 |
| Ge | <0.1 | <0.1 | <0.1 | <0.1 | <0.1 | <0.1 | <0.1 | <0.1 |
| H | 1.0 | 1.0 | 2.0 | 1.0 | <1 | 1.0 | 2.0 | 1.0 |
| Hf | <0.1 | <0.1 | <0.1 | <0.1 | <0.1 | <0.1 | <0.1 | <0.1 |
| Hg | <0.1 | <0.1 | <0.1 | <0.1 | <0.1 | <0.1 | <0.1 | <0.1 |
| In | <0.1 | <0.1 | <0.1 | <0.1 | <0.1 | <0.1 | <0.1 | <0.1 |
| K | <0.01 | <0.01 | <0.01 | <0.01 | <0.01 | <0.01 | <0.01 | <0.01 |
| Li | <0.01 | <0.01 | <0.01 | <0.01 | <0.01 | <0.01 | <0.01 | <0.01 |
| Mg | 0.3 | <0.1 | 0.3 | <0.1 | <0.01 | <0.1 | <0.1 | <0.1 |
| Mn | 0.1 | 0.1 | 1.7 | <0.1 | <0.1 | <0.1 | <0.1 | <0.1 |
| Mo | <0.1 | <0.1 | <0.1 | <0.1 | <0.1 | <0.1 | <0.1 | <0.1 |
| N | <10 | <10 | 20 | <10 | <10 | 10 | <10 | <10 |
| Na | <0.01 | <0.01 | <0.01 | <0.01 | <0.01 | <0.01 | <0.01 | <0.01 |
| Nb | <1 | <1 | <1 | <1 | <1 | <1 | <1 | <1 |
| Ni | 0.7 | 0.7 | 1.6 | 0.4 | <0.1 | 0.6 | 0.9 | 0.4 |
| O | 160 | 160 | 260 | 160 | 100 | 160 | 180 | 160 |
| P | <0.01 | <0.01 | 0.01 | <0.01 | <0.01 | <0.01 | <0.01 | <0.01 |
| Pb | <0.01 | <0.01 | 0.02 | <0.01 | <0.01 | <0.01 | <0.01 | <0.01 |
| Pd | <0.01 | <0.01 | <0.01 | <0.01 | <0.01 | <0.01 | <0.01 | <0.01 |
| Rh | <0.1 | <0.1 | <0.1 | <0.1 | <0.1 | <0.1 | <0.1 | <0.1 |

TABLE 2-continued

| | | | | | | | | |
|---|---|---|---|---|---|---|---|---|
| S | <10 | <10 | <10 | 3.0 | <10 | <10 | <10 | <10 |
| Sb | <0.1 | <0.1 | <0.1 | <0.1 | <0.1 | <0.1 | <0.1 | <0.1 |
| Sc | <0.1 | <0.1 | <0.1 | <0.1 | <0.1 | <0.1 | <0.1 | <0.1 |
| Se | <0.1 | <0.1 | <0.1 | <0.1 | <0.1 | <0.1 | <0.1 | <0.1 |
| Si | 0.2 | 0.2 | 0.6 | 0.2 | 0.8 | 0.3 | 0.4 | 0.2 |
| Sn | <0.1 | <0.1 | <0.1 | <0.1 | <0.1 | <0.1 | <0.1 | <0.1 |
| Te | <0.1 | <0.1 | <0.1 | <0.1 | <0.1 | <0.1 | <0.1 | <0.1 |
| Th | <0.0001 | <0.0001 | <0.0001 | <0.0005 | <0.0001 | <0.0001 | <0.0001 | <0.0001 |
| U | <0.0001 | <0.0001 | <0.0001 | <0.0005 | <0.0001 | <0.0001 | <0.0001 | <0.0001 |
| V | <0.01 | <0.1 | 0.7 | <0.1 | 0.3 | <0.1 | <0.1 | <0.1 |
| W | <0.01 | <0.1 | <0.1 | <0.1 | <0.01 | <0.1 | <0.1 | <0.1 |
| Zn | <0.02 | <0.1 | <0.1 | <0.1 | <0.05 | <0.1 | <0.1 | <0.1 |
| Zr | 0.04 | <1 | <1 | <1 | 0.06 | <1 | <1 | <1 |
| Total Amount | 8.27 | 8.2 | 59.63 | 6.3 | 2.59 | 7.8 | 7.8 | 6.2 |

| | Comparative Example | | | | | | |
|---|---|---|---|---|---|---|---|
| Elements | 4 | 5 | 6 | 7 | 8 | 9 | 10 |
| Ag | <0.1 | <0.1 | <0.1 | <0.1 | <0.1 | <0.1 | <0.1 |
| Al | 1.5 | 0.8 | 1.0 | 1.0 | 0.8 | 0.6 | 0.9 |
| As | <0.1 | <0.1 | <0.1 | <0.1 | <0.1 | <0.1 | <0.1 |
| Am | <0.1 | <0.1 | <0.1 | <0.1 | <0.1 | <0.1 | <0.1 |
| B | <0.01 | <0.01 | <0.01 | <0.01 | <0.01 | <0.01 | <0.01 |
| Ba | <0.01 | <0.01 | <0.01 | <0.01 | <0.01 | <0.01 | <0.01 |
| Be | <0.01 | <0.01 | <0.01 | <0.01 | <0.01 | <0.01 | <0.01 |
| Bi | <0.01 | <0.01 | <0.01 | <0.01 | <0.01 | <0.01 | <0.01 |
| C | <10 | <10 | <10 | <10 | <10 | <10 | <10 |
| Ca | <0.1 | <0.1 | <0.1 | <0.1 | <0.1 | <0.1 | <0.1 |
| Cd | <0.1 | <0.1 | <0.1 | <0.1 | <0.1 | <0.1 | <0.1 |
| Cl | 0.1 | 0.1 | 0.1 | 0.1 | 0.1 | 0.1 | 0.1 |
| Co | <0.1 | <0.1 | <0.1 | <0.1 | <0.1 | <0.1 | <0.1 |
| Cr | 0.1 | <0.1 | 0.2 | <0.1 | 0.1 | 0.1 | 0.1 |
| Cu | 0.2 | 0.2 | 0.2 | 0.1 | 0.1 | 0.2 | 0.2 |
| Fe | 5.2 | 5.9 | 5.1 | 3.8 | 6.3 | 5.6 | 4.7 |
| Ga | <0.05 | <0.05 | <0.05 | <0.05 | <0.05 | <0.05 | <0.05 |
| Ge | <0.1 | <0.1 | <0.1 | <0.1 | <0.1 | <0.1 | <0.1 |
| H | 2.0 | 1.0 | 2.0 | 2.0 | 4.0 | 2.0 | 3.0 |
| Hf | <0.1 | <0.1 | <0.1 | <0.1 | <0.1 | <0.1 | <0.1 |
| Hg | <0.1 | <0.1 | <0.1 | <0.1 | <0.1 | <0.1 | <0.1 |
| In | <0.1 | <0.1 | <0.1 | <0.1 | <0.1 | <0.1 | <0.1 |
| K | <0.01 | <0.01 | <0.01 | <0.01 | <0.01 | <0.01 | <0.01 |
| Li | <0.01 | <0.01 | <0.01 | <0.01 | <0.01 | <0.01 | <0.01 |
| Mg | <0.1 | <0.1 | <0.1 | <0.1 | <0.1 | <0.1 | <0.1 |
| Mn | <0.1 | <0.1 | <0.1 | <0.1 | <0.1 | <0.1 | 0.1 |
| Mo | <0.1 | <0.1 | <0.1 | <0.1 | <0.1 | <0.1 | <0.1 |
| N | <10 | 10 | <10 | 10 | 10 | <10 | 10 |
| Na | <0.01 | <0.01 | <0.01 | <0.01 | <0.01 | <0.01 | <0.01 |
| Nb | <1 | <1 | <1 | <1 | <1 | <1 | <1 |
| Ni | 0.8 | 0.6 | 0.8 | 0.5 | 1.0 | 0.9 | 0.7 |
| O | 180 | 160 | 160 | 180 | 160 | 180 | 180 |
| P | <0.01 | <0.01 | <0.01 | <0.01 | <0.01 | <0.01 | <0.01 |
| Pb | <0.01 | <0.01 | <0.01 | <0.01 | <0.01 | <0.01 | <0.01 |
| Pd | <0.01 | <0.01 | <0.01 | <0.01 | <0.01 | <0.01 | <0.01 |
| Rh | <0.1 | <0.1 | <0.1 | <0.1 | <0.1 | <0.1 | <0.1 |
| S | <10 | <10 | <10 | <10 | <10 | <10 | <10 |
| Sb | <0.1 | <0.1 | <0.1 | <0.1 | <0.1 | <0.1 | <0.1 |
| Sc | <0.1 | <0.1 | <0.1 | <0.1 | <0.1 | <0.1 | <0.1 |
| Se | <0.1 | <0.1 | <0.1 | <0.1 | <0.1 | <0.1 | <0.1 |
| Si | 0.4 | 0.3 | 0.3 | 0.2 | 0.2 | 0.4 | 0.3 |
| Sn | <0.1 | <0.1 | <0.1 | <0.1 | <0.1 | <0.1 | <0.1 |
| Te | <0.1 | <0.1 | <0.1 | <0.1 | <0.1 | <0.1 | <0.1 |
| Th | <0.0001 | <0.0001 | <0.0001 | <0.0001 | <0.0001 | <0.0001 | <0.0001 |
| U | <0.0001 | <0.0001 | <0.0001 | <0.0001 | <0.0001 | <0.0001 | <0.0001 |
| V | <0.1 | <0.1 | <0.1 | <0.1 | <0.1 | <0.1 | <0.1 |
| W | <0.1 | <0.1 | <0.1 | <0.1 | <0.1 | <0.1 | <0.1 |
| Zn | <0.1 | <0.1 | <0.1 | <0.1 | <0.1 | <0.1 | <0.1 |
| Zr | <1 | <1 | <1 | <1 | <1 | <1 | <1 |
| Total Amount | 8.1 | 7.8 | 7.6 | 5.6 | 8.5 | 7.8 | 7.0 |

*The amounts of gas components (H, N, O, S, Cl) are excluded from the total amount. The unit is ppm by mass.

As shown in Table 1, each of the titanium targets of Examples 1 to 5 produced by carrying out cold rolling at a rolling ratio of 30% or more in the rolling step and the heat treatment at a temperature of 320° C. or less in the heat treatment step after the large strain processing had an average crystal grain diameter of a recrystallized structure of 1 μm or less. However, in each of the titanium targets of Comparative Examples 1 to 10, the average crystal grain diameter of the recrystallized structure was more than 1 μm or the recrystallized structure was insufficient, because at least one of the conditions of the rolling step and the heat treatment step was not appropriate.

Further, each of the titanium targets of Examples 1 to 5 had higher Vickers hardness than that of each of the titanium targets of Comparative Examples 1 to 10.

Furthermore, as shown in Table 2, it was confirmed that each of the titanium targets of Examples 1 to 5 had a total amount of elements other than titanium of less than 100 ppm by mass and a purity of 4N or more.

Next, the surfaces of some of the titanium targets obtained in Examples and Comparative Examples were observed using an optical microscope and an SEM.

Figure 1:
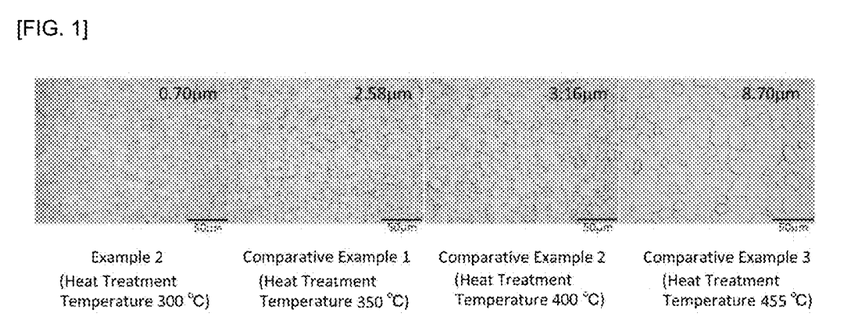
FIG. 1 is a view comparing optical micrographs (×500) of titanium targets of Example 2 and Comparative Examples 1 to 3.
Figure 2:
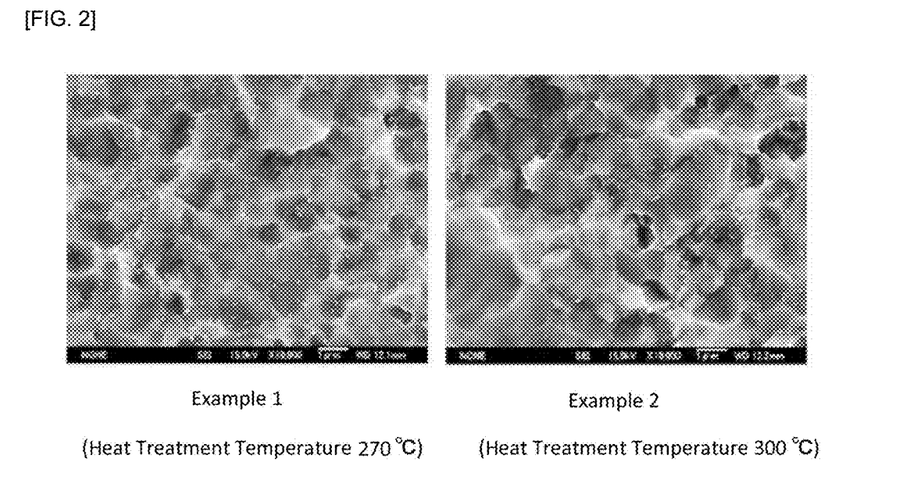
FIG. 2 is a view comparing SEM images (×10000) of titanium targets of Examples 1 and 2.

FIG. 1 shows a view comparing optical micrographs (at magnifications of 500) of the titanium targets of Example 2 and Comparative Examples 1 to 3. FIG. 2 shows a view comparing SEM images (at magnifications of 10000) of the titanium targets of Examples 1 and 2. In FIG. 1, the upper right numeral is the average crystal grain diameter of the recrystallized structure.

As can be seen from FIGS. 1 and 2, the crystal grain diameter of the recrystallized structure tended to decrease as the heat treatment temperature in the heat treatment step decreased.

Figure 3:
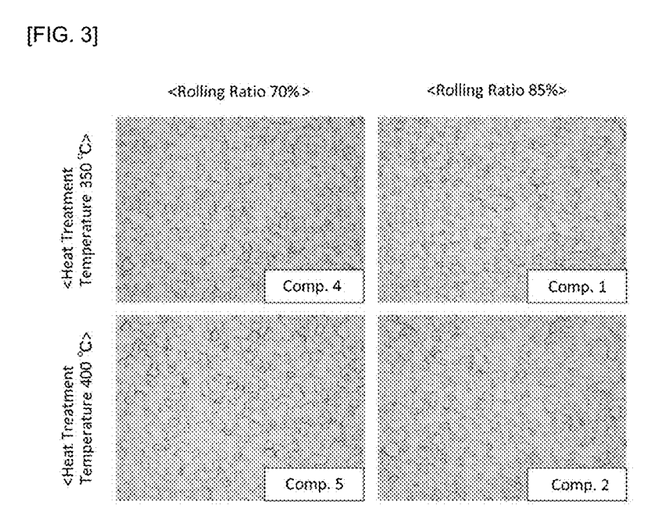
FIG. 3 is a view comparing optical micrographs (×500) of titanium targets of Comparative Examples 1, 2, 4, and 5.

FIG. 3 is a view comparing optical microscope photographs (at magnification of 500) of the titanium targets of Comparative Examples 1, 2, 4 and 5.

As can be seen from FIG. 3, the crystal grain diameter of the recrystallized structure tended to decrease as the rolling ratio in the rolling step increased. Further, as the heat treatment temperature in the heat treatment step decreased, the crystal grain diameter of the recrystallized structure tended to decrease.

Figure 4:
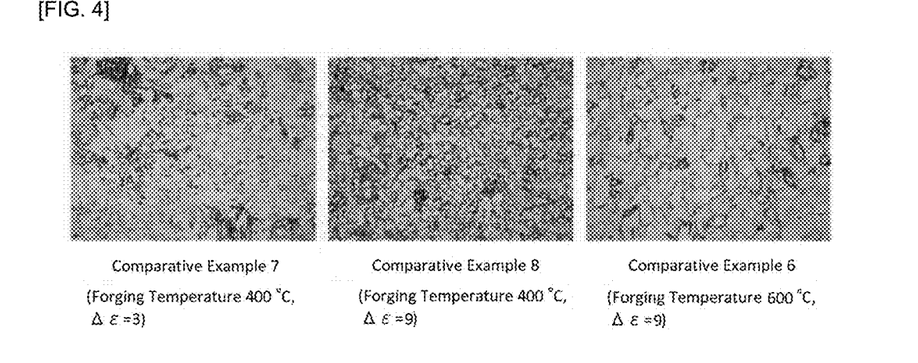
FIG. 4 is a view comparing optical microscope photographs (×200) of titanium targets of Comparative Examples 6 to 8.

FIG. 4 shows a view comparing optical micrographs (at magnification of 200) of the titanium targets of Comparative Examples 6 to 8.

As can be seen from FIG. 4, when the cold rolling was not carried out, the recrystallized structure tended to become non-uniform and the crystal grain diameter of the recrystallized structure tended to increase as the total strain amount ($\Delta\varepsilon$) of the forged sheet decreased in the large strain processing step. Also, as the forging temperature (processing temperature) increased in the large strain processing step, the crystal grain diameter of the recrystallized structure tended to increase.

Figure 5:
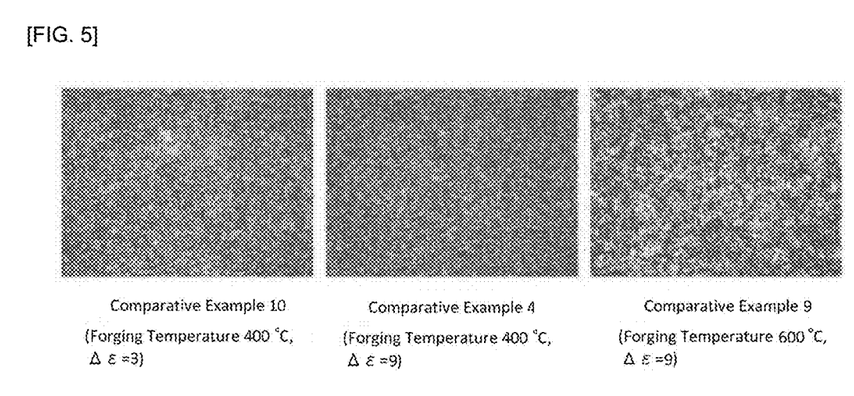
FIG. 5 is a view comparing optical micrographs (×100) of titanium targets of Comparative Examples 4, 9 and 10.

FIG. 5 is a view comparing optical micrographs (at magnification of 100) of the titanium targets of Comparative Examples 4, 9 and 10.

As can be seen from FIG. 5, even if the cold rolling was carried out, a portion where the recrystallized structure was not formed tended to be easily generated as the total strain amount ($\Delta\varepsilon$) of the forged sheet decreased in the large strain processing step. Further, as the processing temperature increased in the large strain processing step, the crystal grain diameter of the recrystallized structure tended to increase, and a portion where the recrystallized structure was not formed tended to be easily generated.

Figure 6:
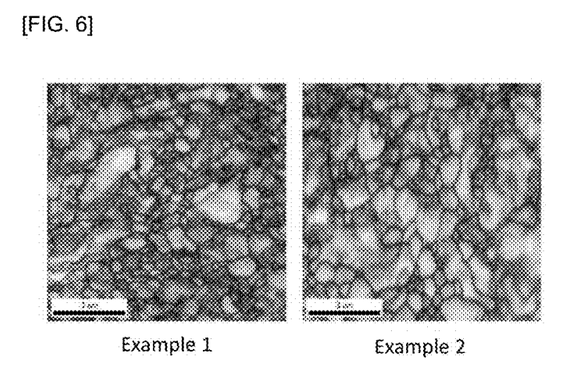
FIG. 6 is grain boundary images of titanium targets of Examples 1 and 2 obtained by electron back scattered diffraction pattern (EBSD).

Next, the grain boundaries of the surface textures of the titanium targets of Examples 1 and 2 were observed by electron back scattered diffraction pattern (EBSD). FIG. 6 shows the resulting grain boundary images. For the EBSD, a device combining JSM-7001F, TTLS-type field emission scanning electron microscope from JEOL Ltd., with an OIM 6.0-CCD/BS-type crystal orientation analyzer was used. The observation was performed by selecting an arbitrary surface area of 10 μm×10 μm and setting the magnification to 10,000 times.

As can be seen from FIG. 6, each of the titanium targets of Examples 1 and 2 had a recrystallized structure in which large-angle grain boundaries and small-angle grain boundaries coexisted. Here, the large-angle grain boundary means a grain boundary having an orientation difference of 15° or more, and the small-angle grain boundary means a grain boundary having an orientation difference of less than 15°.

INDUSTRIAL APPLICABILITY

According to embodiments of the present invention, it is possible to provide a titanium sputtering target which can suppress not only cracks or breakage during sputtering, but also can suppress generation of particles and nodules, and to provide a method for producing the same. Therefore, the titanium sputtering target according to the embodiment of the present invention is used as a sputtering source for forming various thin films (for example, electrodes, gates, wirings, elements, insulating films, and protective films) in various electronic devices such as semiconductor devices, and is particularly suitable for use in high-speed sputtering (high-power sputtering) under higher load conditions.

What is claimed is:

1. A method for producing a titanium sputtering target, the method comprising the steps of:
    subjecting a cut titanium ingot having a purity of 4N (99.99% by mass) or more to strain processing to provide a processed sheet having a total strain amount of 2 or more;
    subjecting the processed sheet to cold rolling at a rolling ratio of 30% or more to provide a rolled sheet; and
    subjecting the rolled sheet to a heat treatment at a temperature of 320° C. or less, wherein the titanium sputtering target produced has an average crystal grain diameter of 1 μm or less.

2. The method for producing the titanium sputtering target according to claim 1, wherein a processing temperature in the strain processing is 500° C. or less.

3. The method for producing the titanium sputtering target according to claim 1, wherein the strain processing is multidirectional forging.

4. The method for producing the titanium sputtering target according to claim 1, wherein a rolling ratio in the cold rolling is more than 70%.

5. The method for producing the titanium sputtering target according to claim 1, wherein a total strain amount of the processed sheet is more than 3.

6. The titanium sputtering target produced using the method according to claim 1.

7. A method for producing a titanium-containing thin film, the method comprising using the titanium sputtering target according to claim 6 as a sputtering source.

8. The method for producing the titanium sputtering target according to claim 2, wherein the strain processing is multidirectional forging.

9. The method for producing the titanium sputtering target according to claim 2, wherein a rolling ratio in the cold rolling is more than 70%.

10. The method for producing the titanium sputtering target according to claim 3, wherein a rolling ratio in the cold rolling is more than 70%.

11. He method for producing the titanium sputtering target according to claim 8, wherein a rolling ratio in the cold rolling is more than 70%.

12. The method for producing the titanium sputtering target according to claim 2, wherein a total strain amount of the processed sheet is more than 3.

13. The method for producing the titanium sputtering target according to claim 3, wherein a total strain amount of the processed sheet is more than 3.

14. The method for producing the titanium sputtering target according to claim 4, wherein a total strain amount of the processed sheet is more than 3.

15. The method for producing the titanium sputtering target according to claim 8, wherein a total strain amount of the processed sheet is more than 3.

16. The method for producing the titanium sputtering target according to claim 9, wherein a total strain amount of the processed sheet is more than 3.

17. The method for producing the titanium sputtering target according to claim 10, wherein a total strain amount of the processed sheet is more than 3.

18. The method for producing the titanium sputtering target according to claim 11, wherein a total strain amount of the processed sheet is more than 3.

19. The method for producing the titanium sputtering target according to claim 1, wherein the average crystal grain diameter is 0.9 μm or less.

20. The method for producing the titanium sputtering target according to claim 1, wherein the average crystal grain diameter is from 0.1 μm to 0.8 μm.

* * * * *